US008638326B2

(12) United States Patent
Ko

(10) Patent No.: US 8,638,326 B2
(45) Date of Patent: Jan. 28, 2014

(54) ORGANIC LIGHT EMITTING DIODE DISPLAY

(75) Inventor: Chun-Seok Ko, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 413 days.

(21) Appl. No.: 12/823,817

(22) Filed: Jun. 25, 2010

(65) Prior Publication Data

US 2011/0164023 A1 Jul. 7, 2011

(30) Foreign Application Priority Data

Jan. 5, 2010 (KR) .................. 10-2010-0000543

(51) Int. Cl.
G06F 3/038 (2013.01)
(52) U.S. Cl.
USPC ........... 345/212; 345/204; 345/211; 313/498; 313/504; 313/512
(58) Field of Classification Search
None
See application file for complete search history.

(56) References Cited

U.S. PATENT DOCUMENTS

| 7,531,954 | B2 * | 5/2009 | Yamada | 313/498 |
| 7,816,858 | B2 * | 10/2010 | Park et al. | 313/504 |
| 8,098,007 | B2 * | 1/2012 | Kim et al. | 313/504 |
| 8,436,529 | B2 * | 5/2013 | Ko et al. | 313/504 |
| 2006/0017665 | A1 * | 1/2006 | Ko et al. | 345/76 |
| 2006/0027804 | A1 * | 2/2006 | Yamazaki et al. | 257/59 |
| 2007/0146615 | A1 * | 6/2007 | Komori | 349/151 |
| 2007/0216299 | A1 * | 9/2007 | Park et al. | 313/512 |
| 2007/0235791 | A1 * | 10/2007 | Park et al. | 257/312 |
| 2007/0278952 | A1 * | 12/2007 | Sung et al. | 313/512 |
| 2008/0012474 | A1 * | 1/2008 | Sung et al. | 313/504 |
| 2008/0042549 | A1 * | 2/2008 | Song et al. | 313/498 |
| 2008/0048948 | A1 * | 2/2008 | Koh et al. | 345/80 |
| 2009/0184899 | A1 | 7/2009 | Kim et al. | |

FOREIGN PATENT DOCUMENTS

| CN | 1734542 | 2/2006 |
| CN | 101043770 | 9/2007 |
| CN | 101127172 | 2/2008 |
| CN | 101488517 A | 7/2009 |
| CN | 101488518 A | 7/2009 |
| JP | 07-111377 | 4/1995 |
| JP | 10-062451 | 3/1998 |
| JP | 2002-32032 A | 1/2002 |
| JP | 2006-39541 A | 2/2006 |
| JP | 2006-235280 A | 9/2006 |
| JP | 2008-052248 A | 3/2008 |
| JP | 2009-169373 A | 7/2009 |

(Continued)

*Primary Examiner* — Dismery Mercedes
(74) *Attorney, Agent, or Firm* — Robert E. Bushnell, Esq.

(57) ABSTRACT

An organic light emitting diode (OLED) display includes: a display panel including a display area having an organic light emitting element for emitting light and a plurality of peripheral areas neighboring the display area; a driver corresponding to one of the plurality of peripheral areas and supplying driving power to the organic light emitting element; a plurality of power transferring units respectively corresponding to the plurality of peripheral areas thereby being respectively connected to the display panel and receiving the driving power from the driver thereby supplying the driving power to the organic light emitting element; and a power connecting unit connecting between the driver and the power transferring unit and at least one power connecting unit between the neighboring power transferring units among the plurality of power transferring units and transmitting the driving power from the driver to the power transferring unit.

19 Claims, 4 Drawing Sheets

(56) References Cited

FOREIGN PATENT DOCUMENTS

| JP | 2009-169374 | 7/2009 |
| JP | 2009-169376 A | 7/2009 |
| KR | 10-2005-0064257 A | 6/2005 |
| KR | 10-2006-0047947 | 5/2006 |
| KR | 10-2006-0084619 | 7/2006 |
| KR | 10-0696486 | 3/2007 |
| TW | 200639783 | 11/2006 |

* cited by examiner

ORGANIC LIGHT EMITTING DIODE DISPLAY

CLAIM OF PRIORITY

This application makes reference to, incorporates the same herein, and claims all benefits accruing under 35 U.S.C§119 from an application entitled ORGANIC LIGHT EMITTING DIODE DISPLAY earlier filed in the Korean Industrial Property Office on Jan. 5, 2010, and there duly assigned Ser. No. 10-2010-0000543 by that Office.

BACKGROUND OF THE INVENTION

1. Field of the Invention

The described technology relates generally to an organic light emitting diode (OLED) display. More particularly, the described technology relates generally to and organic light emitting diode (OLED) display including an organic light emitting element realizing light emitting through driving power supplied from a driver.

2. Description of the Related Art

An organic light emitting diode (OLED) display has been recently spotlighted as a display device for displaying images.

The organic light emitting diode display has a self emissive characteristic, and differs from a liquid crystal display (LCD) in that it does not require a separate light source and has a relatively small thickness and weight. Furthermore, the organic light emitting diode display exhibits high quality characteristics such as low power consumption, high luminance, and short response time.

The conventional organic light emitting diode (OLED) display includes a display panel including an organic light emitting element (an organic light emitting diode) and a driver connected to one side of the display panel and supplying driving power to the organic light emitting element.

Recently, as the size of the display panel has been increased, the number of organic light emitting elements included in the display panel has also increased such that the organic light emitting element of the display panel requires greater driving power.

However, in the conventional organic light emitting diode (OLED) display, the driver is connected to one side of the display panel such that it is difficult to supply sufficient driving power to the organic light emitting element included in the display panel having the increased size.

The above information disclosed in this Background section is only for enhancement of understanding of the background of the described technology and therefore it may contain information that does not form the prior art that is already known in this country to a person of ordinary skill in the art.

SUMMARY OF THE INVENTION

An exemplary embodiment supplies sufficient driving power to a display panel having an increased size.

An organic light emitting diode (OLED) display of the exemplary embodiment includes: a display panel including a display area having an organic light emitting element for emitting light and a plurality of peripheral areas neighboring the display area; a driver corresponding to one of the plurality of peripheral areas and supplying driving power to the organic light emitting element; a plurality of power transferring units respectively corresponding to the plurality of peripheral areas thereby being respectively connected to the display panel and receiving the driving power from the driver thereby supplying the driving power to the organic light emitting element; and a power connecting unit connecting between the driver and the power transferring unit and at least one power connecting unit between the neighboring power transferring units among the plurality of power transferring units and transmitting the driving power from the driver to the power transferring unit.

The driving power includes a first power and a second power.

The organic light emitting element may include a first electrode supplied with the first power, an organic emission layer disposed on the first electrode, and a second electrode disposed on the organic emission layer and supplied with the second power. At least one of the connections between the power connecting unit and the driver and between the power connecting unit and the power transferring unit may be executed by using a connector.

The display area may have a quadrangle shape at the plane of the display panel, and the plurality of peripheral areas may include: a first peripheral area corresponding to a first edge of the quadrangle; a second peripheral area corresponding to a second edge neighboring the first edge of the quadrangle; a third peripheral area corresponding to a third edge neighboring the first edge of the quadrangle and simultaneously facing the second edge; and a fourth peripheral area corresponding to a fourth edge facing the first edge of the quadrangle, and the driver is disposed corresponding to the first peripheral area.

The plurality of power transferring units may include: a first power transferring unit corresponding to the second peripheral area and connecting the display panel and the driver; a second power transferring unit corresponding to the third peripheral area and connecting the display panel and the driver; and a third power transferring unit corresponding to the fourth peripheral area and connecting the display panel and the power connecting unit.

The third power transferring unit may be plural, and the neighboring third power transferring units are separated from each other.

The plurality of power transferring units may include: a fourth power transferring unit corresponding to the first peripheral area and connecting the display panel and the driver; a fifth power transferring unit corresponding to the second peripheral area and connecting the display panel and the power connecting unit; a sixth power transferring unit corresponding to the third peripheral area and connecting the display panel and the power connecting unit; and a seventh power transferring unit corresponding to the fourth peripheral area and connecting the display panel and the power connecting unit.

The fourth power transferring unit, the fifth power transferring unit, the sixth power transferring unit, and the seventh power transferring unit may be plural.

The seventh power transferring unit neighboring the fifth power transferring unit among the plurality of seventh power transferring units may be connected to the fifth power transferring unit through the power connecting unit, and the seventh power transferring unit neighboring the sixth power transferring unit among the plurality of seventh power transferring units may be connected to the sixth power transferring unit through the power connecting unit.

The power transferring unit may be a flexible printed circuit board (FPCB), and the power connecting unit may be a flexible flat cable (FFC).

According to the exemplary embodiment, an organic light emitting diode (OLED) display supplying sufficient driving power a display panel of a large size is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
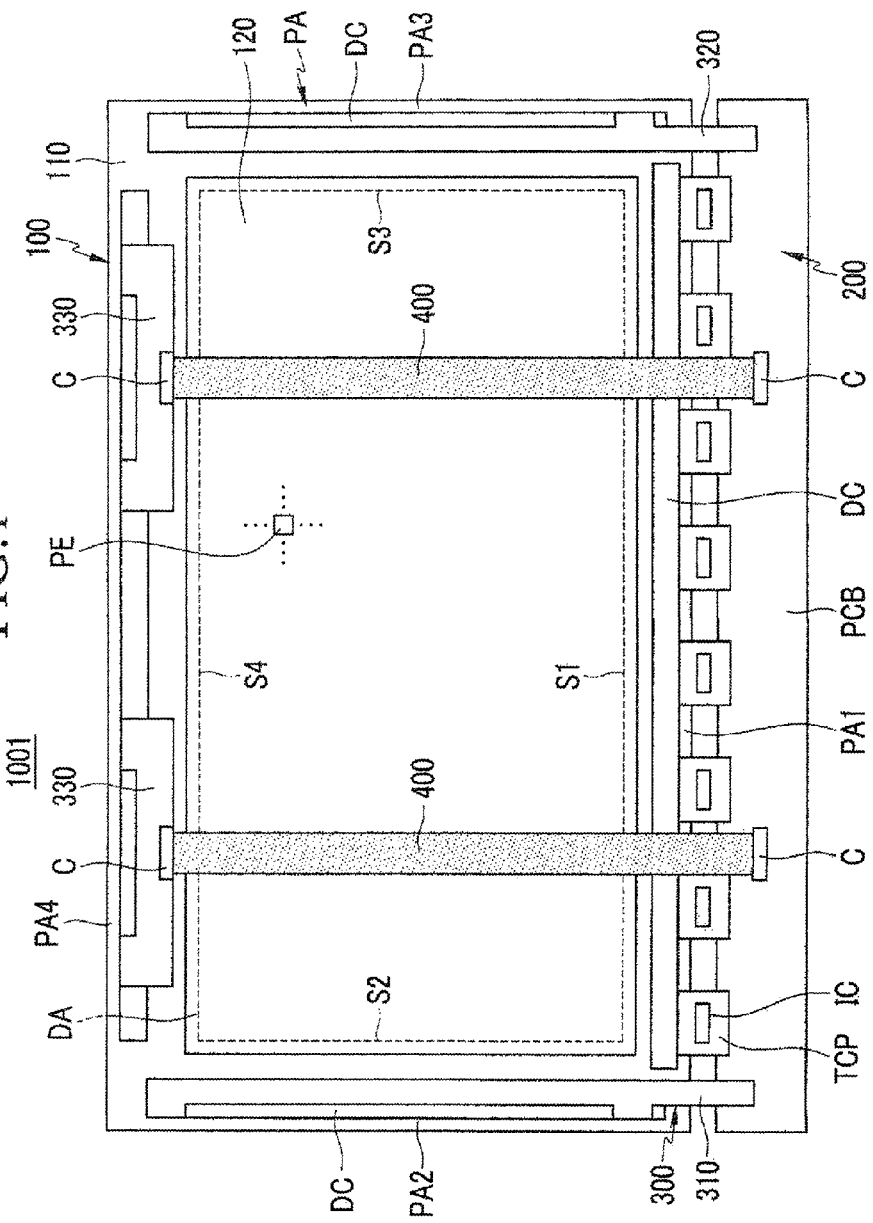
FIG. 1 is a top plan view of an organic light emitting diode display according to a first exemplary embodiment.

The exemplary embodiments will be described more fully hereinafter with reference to the accompanying drawings, in which exemplary embodiments are shown. As those skilled in the art would realize, the described embodiments may be modified in various different ways, all without departing from the spirit or scope of the present invention.

Parts that are irrelevant to the description are omitted in order to clearly describe the exemplary embodiment, and like reference numerals designate like elements throughout the specification.

Furthermore, with exemplary embodiments, detailed description is given for constituent elements in the first exemplary embodiment with reference to the relevant drawings by using the same reference numerals for the same constituent elements, and only different constituent elements from those related to the first exemplary embodiment are described in other exemplary embodiments.

Furthermore, as the size and thickness of the respective structural components shown in the drawings are arbitrarily illustrated for explanatory convenience, the present invention is not necessarily limited to as illustrated.

In the drawings, the thickness of layers, films, panels, regions, etc., are exaggerated for clarity and explanatory convenience. It will be understood that when an element such as a layer, film, region, or substrate is referred to as being "on" another element, it can be directly on the other element or intervening elements may also be present.

Over the whole specification, when an element is said to include another constituent element, it may additionally include other constituent elements but may not exclude them unless a specific limitation to the contrary is made. Furthermore, it will be understood throughout the specification that when an element is referred to as being "on" another element, it may be placed over or below the other element but is not necessarily placed over the other element, based on the direction of gravity.

An organic light emitting diode display 1001 according to a first exemplary embodiment will now be described with reference to FIG. 1 to FIG. 3.

FIG. 1 is a top plan view of an organic light emitting diode display according to a first exemplary embodiment.

As shown in FIG. 1, an organic light emitting diode (OLED) display 1001 includes a display panel 100, a driver 200, a power transferring unit 300, and a power connecting unit 400.

The display panel 100 has a first substrate 110 and a second substrate 120 that are cohered and sealed to each other, and includes a display area DA and a peripheral area PA.

The display area DA includes a plurality of pixels PE, and each pixel PE includes an organic light emitting element (organic light emitting diode) (70, referring to FIG. 2) for emitting light. That is, the display area DA is a region displaying images by using the light emitted from each pixel PE. The display area DA has a quadrangle shape on the plane of the display panel 100 including a first edge S1, a second edge S2 neighboring the first edge S1, a third edge S3 neighboring the first edge S1 and simultaneously corresponding to the second edge S2, and a fourth edge S4 corresponding to the first edge S1.

The display area DA of the organic light emitting diode (OLED) display 1001 according to the first exemplary embodiment has the quadrangle shape, however the display area DA of an organic light emitting diode (OLED) display according to another exemplary embodiment may have a triangle, a polygon, or a circle shape.

A plurality of peripheral areas PA are positioned adjacent to the display area DA of the quadrangle shape.

The plurality of peripheral areas PA enclose the display area DA and include a plurality of driving circuits DC. Each driving circuit DC transfers a signal to the pixel PE to drive the pixel PE. The plurality of peripheral areas PA include a first peripheral area PA1 corresponding to the first edge S1, a second peripheral area PA2 corresponding to the second edge S2, a third peripheral area PA3 corresponding to the third edge S3, and a fourth peripheral area PA4 corresponding to the fourth edge S4. The first peripheral area PA1 to the fourth peripheral area PA4 enclose the display area DA.

The organic light emitting diode (OLED) display 1001 according to the first exemplary embodiment includes driving circuits DC formed in the peripheral area PA, however in the organic light emitting diode (OLED) display according to another exemplary embodiment, the driving circuit may not be formed in the peripheral area. Other features of FIG. 1 will be discussed later.

Next, a structure of a pixel PE included in the organic light emitting diode (OLED) display 100 according to the first exemplary embodiment will be described with reference to FIG. 2 and FIG. 3.

Figure 2:
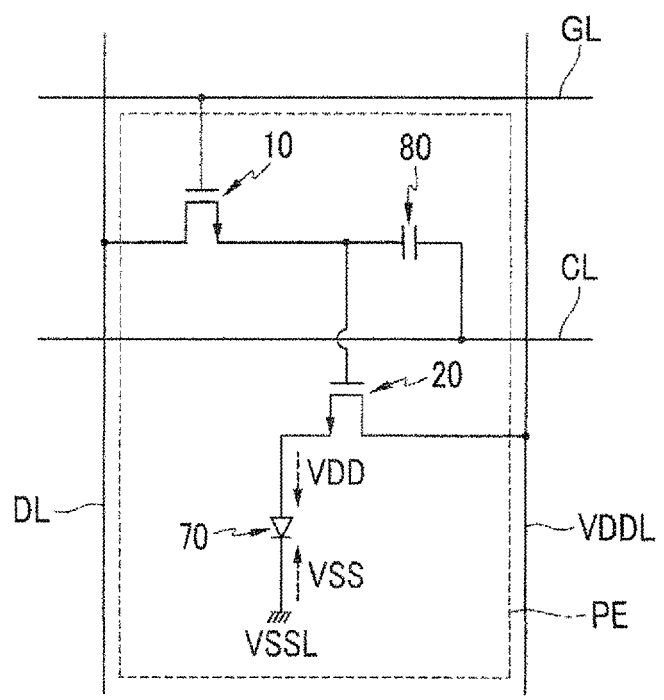
FIG. 2 is a circuit diagram of a pixel of an organic light emitting diode (OLED) display according to the first exemplary embodiment.

FIG. 2 is a circuit diagram of a pixel of an organic light emitting diode (OLED) display according to the first exemplary embodiment.

As shown in FIG. 2, in the display panel 100 included in the organic light emitting diode (OLED) display 1001 according to the first exemplary embodiment, one pixel PE has a 2Tr-1Cap structure including an organic light emitting element (organic light emitting diode) 70, two thin film transistors (TFT) 10 and 20, and one capacitor 80. However, an exemplary embodiment is not limited thereto. The organic light emitting diode display 1001 may be variously structured such that three or more thin film transistors and two or more capacitors are provided at one pixel PE together with a separate wire. The additional thin film transistors and capacitors form a compensation circuit.

The compensation circuit improves the uniformity of the organic light emitting diode 70 formed at each pixel PE, and prevents the image quality from being deviated. The compensation circuit includes two to eight thin film transistors.

The organic light emitting diode 70 includes an anode being a hole injection electrode, a cathode being an electron injection electrode, and an organic emissive layer disposed between the anode and the cathode.

One pixel PE includes first thin film transistor 10 and second thin film transistor 20.

The first and second thin film transistors 10 and 20 each include a gate electrode, a semiconductor layer, a source electrode, and a drain electrode.

FIG. 2 illustrates a structure with a gate line GL, a data line DL, a common power line VDDL, and a capacitor line CL, but the pixel of the display panel 100 included in the organic light emitting diode (OLED) display 1001 according to an exemplary embodiment is not limited to the structure illustrated in FIG. 2. The capacitor line CL may be omitted as needed.

A source electrode of the first thin film transistor 10 is connected to the data line DL, and a gate electrode of the first thin film transistor 10 is connected to the gate line GL. A drain electrode of the first thin film transistor 10 is connected to the capacitor line CL via the capacitor 80. A node is formed between the drain electrode of the first thin film transistor 10 and the capacitor 80, and the gate electrode of the second thin film transistor 20 is connected to the node. A common power line VDDL is connected to the drain electrode of the second thin film transistor 20, and the anode electrode of the organic light emitting diode 70 is connected to the source electrode.

The first thin film transistor 10 is used as a switch for selecting a target pixel PE to be excited. When the first thin film transistor 10 turns on, the capacitor 80 is charged. At this time, the amount of charge is proportional to the potential of the voltage applied from the data line DL. In the state in which the first thin film transistor 10 turns off, if signals are input to the capacitor line CL while increasing the voltage by a cycle of one frame, the gate potential of the second thin film transistor 20 is increased along with the voltage applied through the capacitor line CL, based on the potential of the capacitor 80. When the gate potential of the second thin film transistor 20 goes over the threshold voltage, the second thin film transistor 20 turns on. Then, a first power VDD, as a driving power applied to the common power line VDDL from a driver 200 that will be described later, is applied to the anode of the organic light emitting diode 70 through the second thin film transistor 20.

Also, the cathode of the organic light emitting element 70 is applied with a second power VSS as a second driving power applied from the driver 200 at terminal VSSL, and thereby the organic light emitting element 70 emits light by the first power VDD applied to the anode of the organic light emitting element 70 through the second thin film transistor 20 and the second power VSS applied to the cathode.

The configurations of the pixel PE are not limited to as above-described, but may be variously modified provided that such modifications can be easily appreciated and made by a person skilled in the art.

Figure 3:
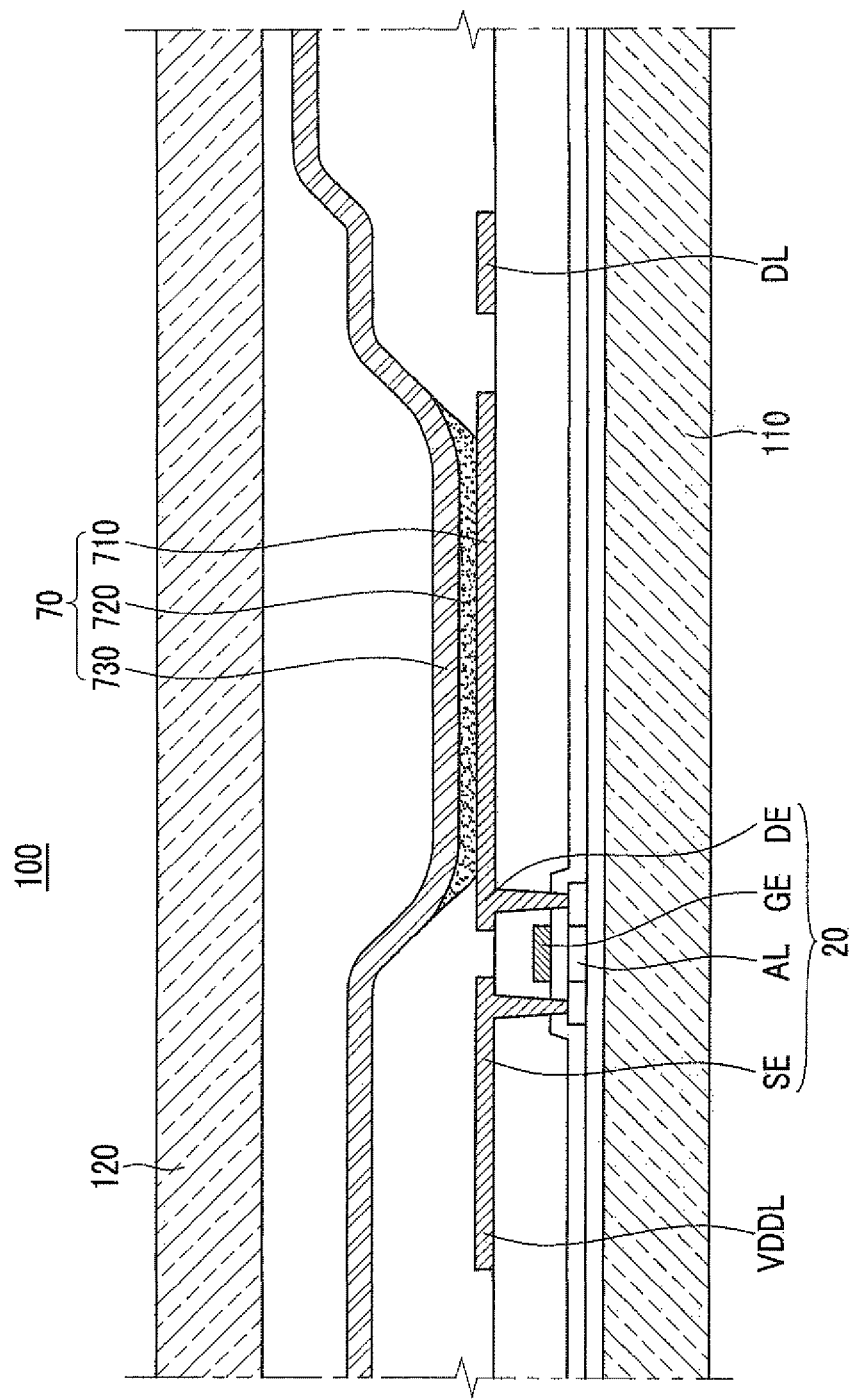
FIG. 3 is a cross-sectional view of a portion of a pixel of an organic light emitting diode (OLED) display according to the first exemplary embodiment.

FIG. 3 is a cross-sectional view of a portion of the pixel of the organic light emitting diode (OLED) display according to the first exemplary embodiment. Referring to FIG. 3, an organic light emitting diode display 1001 according to an exemplary embodiment will now be described in detail on the basis of the second thin film transistor 20 and the organic light emitting element 70 by the deposition sequence thereof.

As shown in FIG. 3, the second thin film transistor 20 includes a semiconductor layer AL, a gate electrode GE, a source electrode SE, and a drain electrode DE.

The second thin film transistor 20 receives the first power VDD as the driving power for light-emitting the organic light emitting element 70 of the selected pixel PE from the common power line VDDL, and applies it to the first electrode 710 of the organic light emitting element 70 through the source electrode SE, the semiconductor layer AL, and the drain electrode DE. The first electrode 710 of the organic light emitting element 70 is positioned to be extended from the drain electrode DE, and the drain electrode DE and the first electrode 710 are connected to each other.

The organic light emitting element 70 includes a first electrode 710, an organic emission layer 720 disposed on the first electrode 710, and a second electrode 730 disposed on the organic emission layer 720.

The first electrode 710 is the anode as the hole injection electrode, and the second electrode 730 is the cathode as the electron injection electrode. However, the first exemplary embodiment is not necessarily limited thereto, and depending upon the way of driving the display device 1001, the first electrode 710 may function as a cathode and the second electrode 730 may function as an anode. If the first power VDD as the driving power applied from the driver 200 is supplied to the first electrode 710 by the second thin film transistor 20 and the second power VSS as the driving power applied from the driver 200 is supplied to the second electrode 730, holes and electrons are injected inside the organic emission layer 720 from the first electrode 710 and the second electrode 730, and the light emitting of the organic emission layer 720 is realized when the excitons being combinations of the holes and electrons injected inside the organic emission layer 720 drop from an excited state to a ground state. At least the first electrode 710 is formed with a single-layered or multiple-layered light transmittance conductive layer containing at least one material of indium tin oxide (ITO) and indium zinc oxide (IZO), and the second electrode 730 is formed with a single-layered or multiple-layered light reflective conductive layer containing at least one material of aluminum (Al) and silver (Ag).

The organic emission layer 720 is the layer where the holes and the electrons respectively injected from the first electrode 710 and the second electrode 730 are combined to each other, thereby emitting light of red, green, or blue.

As described above, in the organic light emitting diode (OLED) display 1001 according to the first exemplary embodiment, the organic light emitting element 70 emits the light in the direction of the first substrate 110. That is, the organic light emitting diode (OLED) display 1001 is the rear light emitting type.

In the other hand, in the organic light emitting diode (OLED) display according to another exemplary embodiment, the first electrode 710 may be made of the light reflective conducting material and the second electrode 730 may be made of the light transmittance conducting material thereby realizing the front light emitting type of organic light emitting diode (OLED) display, or the first electrode 710 and the second electrode 730 may be made of the light transmittance conducting material thereby realizing both a front and rear light emitting type of organic light emitting diode (OLED) display.

As described above, the organic light emitting element 70 of the display panel 100 is supplied with the driving power of the driver 200, and the light emitting of the organic light emitting element 70 is executed by the supplied driving power.

Again referring to FIG. 1, the driver 200, the power transferring unit 300, and the power connecting unit 400 will be described in detail.

As shown in FIG. 1, the driver 200 includes a plurality of driving chips IC and a flexible printed circuit (FPC) PCB. The flexible printed circuit (FPC) PCB is electrically connected to the display panel 100 by tape carrier packages TCP.

One end of each of the tape carrier packages TCP is attached to the first peripheral area PA1 of the display panel 100 at a predetermined interval, and the other ends are attached to the flexible printed circuits (FPC) PCB. The ends of the tape carrier package TCP may be connected to the driving circuit DC of the display panel 100 and the flexible printed circuit (FPC) PCB by using a connection member such as an anisotropic conductive film (ACF). The flexible printed circuit (FPC) PCB may supply gate power, data power, the first power VDD as the common power, and the second power VSS as the cathode power, respectively, to the gate line GL, the data line DL, the common power line VDDL and the second electrode 730 by the tape carrier package TCP through the driving circuit DC of the display panel 100.

Particularly, the driver 200 supplies the driving power to drive the organic light emitting element 70, and as described above, the driving power supplied from the driver 200 includes the first power VDD and the second power VSS, where the first power VDD is supplied to the first electrode 710 as the anode of the organic light emitting element 70, and the second power VSS is supplied to the second electrode 730 as the cathode of the organic light emitting element 70.

As described above, the driving power including the first power VDD and the second power VSS among the power supplied from the driver 200 is supplied to the first electrode 710 and the second electrode 730 while defects such as a voltage drop according to resistance of the second electrode 730 or resistance of the common power line VDDL supplied with the driving power are minimized, and this is executed by the power transferring unit 300 and the power connecting unit 400.

The power transferring units 300 are plural, and respectively correspond to the plurality of peripheral areas PA2-PA4 thereby being connected to the display panel 100. The power transferring units 300 receive the driving power including the first power VDD and the second power VSS from the driver 200, and transfer the driving power to the organic light emitting element 70 through the driving circuit DC. A plurality of power transferring units 300 include a first power transferring unit 310, a second power transferring unit 320, and a third power transferring unit 330.

The first power transferring unit 310 corresponds to the second peripheral area PA2 of the display panel 100 and connects between the display panel 100 and the driver 200. The first power transferring unit 310 receives the driving power for driving the organic light emitting element 70 from the driver 200, and transmits the first power VDD and the second power VSS as the driving power to the organic light emitting element 70 formed inside the pixel PE disposed corresponding to the second edge S2 of the display area DA. Ends of the first power transferring unit 310 may be respectively connected to the driving circuit DC of the display panel 100 and the driver 200 through the connection member such as the anisotropic conductive film.

The second power transferring unit 320 corresponds to the third peripheral area PA3 of the display panel 100, and connects between the display panel 100 and the driver 200. The second power transferring unit 320 receives the driving power for driving the organic light emitting element 70 from the driver 200, and transmits the first power VDD and the second power VSS as the driving power to the organic light emitting element 70 formed inside the pixel PE disposed corresponding to the third edge S3 of the display area DA. Ends of the second power transferring unit 320 may be respectively connected to the driving circuit DC of the display panel 100 and the driver 200 through the connection member such as the anisotropic conductive film.

The third power transferring unit 330 corresponds to the fourth peripheral area PA4 of the display panel 100, and connects between the display panel 100 and the power connecting unit 400. The third power transferring unit 330 receives the driving power for driving the organic light emitting element 70 through the power connecting unit 400 from the driver 200, and transmits the first power VDD and the second power VSS as the driving power to the organic light emitting element 70 formed inside the pixel PE disposed corresponding to the fourth edge S4 of the display area DA. One end of the third power transferring unit 330 may be connected to the driving circuit DC of the display panel 100 through the connection member such as the anisotropic conductive film. The third power transferring unit 330 may be provided in plural with the same shape, and the plurality of third power transferring units 330 are respectively connected to the power connecting unit 400, however the neighboring third power transferring units 330 are separated from each other.

The first power transferring unit 310, the second power transferring unit 320, and the third power transferring unit 330 are connected to the display panel 100 such that the structures thereof are complicated, and for example, the power transferring units 300 may be flexible printed circuit boards (FPCB), but are not limited thereto.

The power connecting unit 400 connects the driver 200 and the third power transferring unit 330, and receives the driving power including the first power VDD and the second power VSS from the driver 200 and transmits it to the power transferring unit 300. The power connecting unit 400 only receives the driving power transmitted from the driver 200 to the power transferring unit 300, and is connected to the display panel 100 such that a cable having a simpler structure than the power transferring unit 300 having the complicated structure may be used. For example, the power connecting unit 400 may be a flexible flat cable (FFC), but is not limited thereto. As described above, the power connecting unit 400 has the simple structure compared with the power transferring unit 300 such that it is not necessary to use the anisotropic conductive film for the connection between the power connecting unit 400 and the driver 200 and the connection between the power connecting unit 400 and the power transferring unit 300, and a connector C including a male connector and a female connector is used.

As described above, the organic light emitting diode (OLED) display 1001 according to the first exemplary embodiment respectively supplies the driving power including the first power VDD and the second power VSS driving the organic light emitting element 70 to the first edge S1 to the fourth edge S4 of the display area DA of the display panel 100 such that a substantially equivalent driving power is applied to the whole organic light emitting element 70 included in the display panel 100 with the large size, and thereby a image having uniform luminance may be realized for the whole display panel 100. That is, the organic light emitting diode (OLED) display 1001 having improved display quality is provided.

Also, in the organic light emitting diode (OLED) display 1001 according to the first exemplary embodiment, the power transferring unit 300 neighboring the driver 200 is directly connected to the driver 200 and the power transferring unit 300 separated from the driver 200 is indirectly connected to the driver 200 through the power connecting unit 400 such that it is not necessary that the size of the power transferring unit 300 separated from the driver 200 is extended from the portion where the power transferring unit 300 is connected to the display panel 100 to the portion where the driver 200 is positioned. That is, it is not necessary to increase the size of the power transferring unit 300 connected to the display panel 100 although the size of the display panel 100 is increased such that the manufacture time and the manufacturing cost to increase the size of the power transferring unit 300 maybe reduced. Thereby, this reduces the whole manufacture time and manufacturing cost for the organic light emitting diode (OLED) display 1001.

Also, in the organic light emitting diode (OLED) display 1001 according to the first exemplary embodiment, the driving power supplied from the driver 200 is transmitted to the organic light emitting element 70 disposed in the display area DA of the display panel 100 through the plurality of power transferring units 300 such that the driving power supplied to the organic light emitting element 70 of the display panel 100 may be dispersed and transmitted compared with the method in which the driving power is input to the organic light emitting element 70 by only a tape carrier package (TCP). This prevents the driving power applied to the organic light emitting element 70 from being partially transmitted such that the driving reliability of the organic light emitting diode (OLED) display 1001 may be wholly improved.

Also, in the organic light emitting diode (OLED) display 1001 according to the first exemplary embodiment, the power transferring unit 300 that is the portion connected to the display panel 100 uses a flexible printed circuit (FPC) having the relatively complicated structure, however the portion connecting the driver 200 and the power transferring unit 300 uses the flexible flat cable having the simpler structure than the power transferring unit 300 such that the manufacturing time and the manufacturing cost of the organic light emitting diode (OLED) display 1001 may be reduced.

As described above, the organic light emitting diode (OLED) display 1001 according to the first exemplary embodiment may simultaneously supply sufficient driving power to the display panel 100 having the large size, and the manufacturing time and the manufacturing cost may be reduced.

Next, an organic light emitting diode (OLED) display 1002 according to the second exemplary embodiment will be described with reference to FIG. 4.

Figure 4:
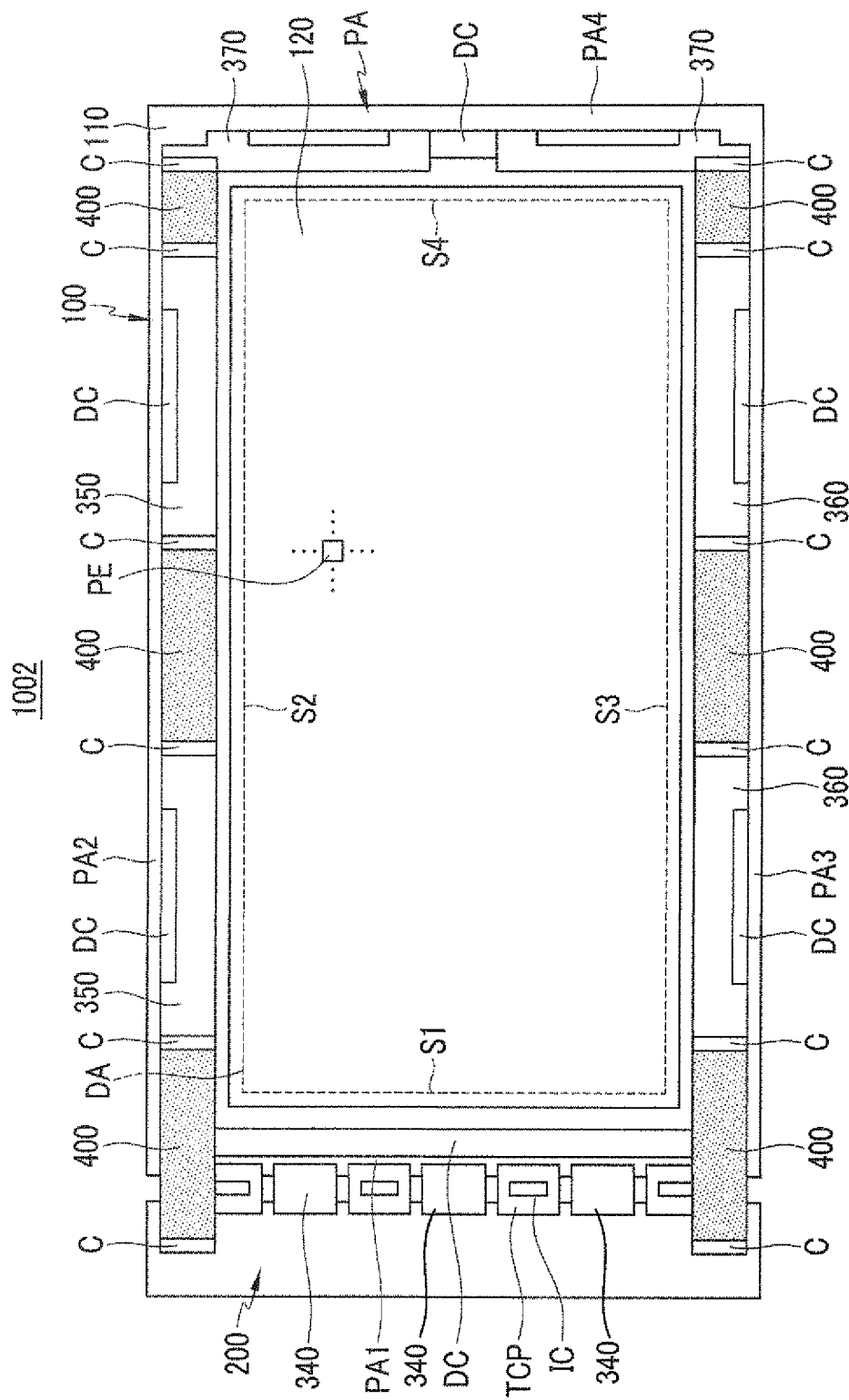
FIG. 4 is a top plan view of an organic light emitting diode (OLED) display according to the second exemplary embodiment.

FIG. 4 is a top plan view of an organic light emitting diode (OLED) display according to the second exemplary embodiment.

As shown in FIG. 4, a plurality of power transferring units 300 corresponding to a plurality of peripheral areas PA are connected to the display panel 100. The power transferring unit 300 receives the driving power including the first power VDD and the second power VSS from the driver 200, and transmits it to the organic light emitting element 70 through the driving circuit DC. The plurality of power transferring units 300 includes a fourth power transferring unit 340, a fifth power transferring unit 350, a sixth power transferring unit 360, and a seventh power transferring unit 370.

The fourth power transferring unit 340 corresponds to the first peripheral area PA1 of the display panel 100, and connects the display panel 100 and the driver 200. The fourth power transferring unit 340 receives the driving power to drive the organic light emitting element 70 from the driver 200, and transmits the first power VDD and the second power VSS as the driving power to the organic light emitting element 70 formed in the pixel PE disposed corresponding to the first edge S1 of the display area DA. Ends of the fourth power transferring unit 340 are respectively connected to the driving circuit DC of the display panel 100 and the driver 200 through the connection member such as the anisotropic conductive film. The fourth power transferring units 340 are plural, and each fourth power transferring unit 340 is disposed between the neighboring tape carrier packages TCP.

The fifth power transferring unit 350 corresponds to the second peripheral area PA2 of the display panel 100, and connects the display panel 100 and the power connecting unit 400. The fifth power transferring unit 350 receives the driving power to drive the organic light emitting element 70 through the power connecting unit 400 from the driver 200, and transmits the first power VDD and the second power VSS as the driving power to the organic light emitting element 70 formed in the pixel PE disposed corresponding to the second edge S2 of the display area DA. One end of the fifth power transferring unit 350 maybe connected to the driving circuit DC of the display panel 100 through the connection member such as the anisotropic conductive film. The fifth power transferring units 350 are plural, and the power connecting unit 400 connects between the neighboring fifth power transferring units 350.

The sixth power transferring unit 360 corresponds to the third peripheral area PA3 of the display panel 100, and connects the display panel 100 and the power connecting unit 400. The sixth power transferring unit 360 receives the driving power to drive the organic light emitting element 70 through the power connecting unit 400 from the driver 200, and transmits the first power VDD and the second power VSS as the driving power to the organic light emitting element 70 formed in the pixel PE disposed corresponding to the third edge S3 of the display area DA. One end of the sixth power transferring unit 360 maybe connected to the driving circuit DC of the display panel 100 through the connection member such as the anisotropic conductive film. The sixth power transferring units 360 are plural, and the power connecting unit 400 connects between the neighboring sixth power transferring units 360.

The seventh power transferring unit 370 corresponds to the fourth peripheral area PA4 of the display panel 100, and connects the display panel 100 and the power connecting unit 400. The seventh power transferring unit 370 receives the driving power to drive the organic light emitting element 70 through the power connecting unit 400 from the driver 200, and transmits the first power VDD and the second power VSS as the driving power to the organic light emitting element 70 formed in the pixel PE disposed corresponding to the fourth edge S4 of the display area DA. One end of the seventh power transferring unit 370 may be connected to the driving circuit DC of the display panel 100 through the connection member such as the anisotropic conductive film. The seventh power transferring units 370 are plural, and the power connecting unit 400 connects between the neighboring seventh power transferring units 370. The seventh power transferring unit 370 neighboring the fifth power transferring unit 350 among the plurality of the seventh power transferring units 370 is connected to the fifth power transferring unit 350 by the power connecting unit 400, and the seventh power transferring unit 370 neighboring the sixth power transferring unit 360 is connected to the sixth power connecting unit by the power connecting unit 400. That is, the seventh power transferring unit 370 is connected to the driver 200 through the power connecting unit 400 and the fifth power transferring unit 350 or the power connecting unit 400 and the sixth power transferring unit 360 thereby receiving the driving power from the driver 200 and transmitting the driving power to the organic light emitting element 70 formed in the pixel PE disposed corresponding to the fourth edge S4 of the display area DA of the display panel 100.

The power connecting unit 400 connects between the driver 200 and the fifth power transferring unit 350, between the driver 200 and the sixth power transferring unit 360, between the neighboring fifth power transferring units 350 among the plurality of fifth power transferring units 350, or between the neighboring sixth power transferring units 360 among the plurality of the sixth power transferring unit 360, and receives the driving power including the first power VDD and the second power VSS from the driver 200 to transmit it to the fifth power transferring unit 350, the sixth power transferring unit 360, and the seventh power transferring unit 370. The power connecting unit 400 supplies only the driving power to the power transferring unit 300 from the driver 200 such that it may have a simple structure compared with the power transferring unit 300 having the complicated structure for the connection with the display panel 100. As described above, the power connecting unit 400 has the simple structure compared with the power transferring unit 300 such that it is not necessary to use the anisotropic conductive film for the connection between the driver 200 connected to the power connecting unit 400, and for the connection between the fifth power transferring unit 350, the sixth power transferring unit 360, and the seventh power transferring unit 370, and a connector C including a male connector and a female connector is used.

As described above, in the organic light emitting diode (OLED) display 1002 according to the second exemplary embodiment, although the size of the display panel 100 is increased, the plurality of power transferring units 300 that are connected to each other with the predetermined size are applied to the display panel 100 having the large size by connecting between the power transferring units 300 of the predetermined size through the power connecting unit 400 such that it is not necessary to additionally increase the size of the power transferring unit 300 corresponding to the display panel 100 of the large size. Also, it is not necessary to replace a process device for handling the power transferring unit 300 of the predetermined size corresponding to the power transferring unit 300 of the large size to the different process device handling for the power transferring unit 300 of the large size. Accordingly, the total manufacturing time and manufacturing cost of the organic light emitting diode (OLED) display 1002 may be reduced.

As described above, the organic light emitting diode (OLED) display 1002 according to the second exemplary embodiment may supply sufficient driving power to the display panel 100 of the large size, and simultaneously reduce the manufacturing time and the manufacturing cost.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a display panel including a display area having an organic light emitting element for emitting light and a plurality of peripheral areas neighboring the display area;
   a driver corresponding to one of the plurality of peripheral areas and supplying driving power to the organic light emitting element;
   a plurality of power transferring units respectively corresponding to the plurality of peripheral areas, the plurality of power transferring units being respectively connected to the display panel and receiving the driving power from the driver thereby supplying the driving power to the organic light emitting element; and
   a plurality of power connecting units directly connecting between the driver and predetermined ones of the power transferring units and transmitting the driving power from the driver to the predetermined ones of the power transferring units.

2. The organic light emitting diode (OLED) display of claim 1, the driving power including a first power and a second power, and the organic light emitting element including:
   a first electrode supplied with the first power;
   an organic emission layer disposed on the first electrode; and
   a second electrode disposed on the organic emission layer and supplied with the second power.

3. The organic light emitting diode (OLED) display of claim 2, at least one connection between the power connecting units and the driver and between the power connecting units and the power transferring units being executed by using a connector.

4. The organic light emitting diode (OLED) display of claim 3, the display area having a quadrangle shape at the plane of the display panel, and the plurality of peripheral areas include:
   a first peripheral area corresponding to a first edge of the quadrangle, the driver being disposed corresponding to the first peripheral area;
   a second peripheral area corresponding to a second edge neighboring the first edge of the quadrangle;
   a third peripheral area corresponding to a third edge neighboring the first edge of the quadrangle and simultaneously facing the second edge; and
   a fourth peripheral area corresponding to a fourth edge facing the first edge of the quadrangle.

5. The organic light emitting diode (OLED) display of claim 4, the plurality of power transferring units including:
   a first power transferring unit corresponding to the second peripheral area and connecting the display panel and the driver;
   a second power transferring unit corresponding to the third peripheral area and connecting the display panel and the driver; and
   a third power transferring unit corresponding to the fourth peripheral area and connecting the display panel and the power connecting unit.

6. The organic light emitting diode (OLED) display of claim 5, the third power transferring unit being plural, and the neighboring third power transferring units are separated from each other.

7. The organic light emitting diode (OLED) display of claim 4, the plurality of power transferring units including:
   a fourth power transferring unit corresponding to the first peripheral area and connecting the display panel and the driver;
   a fifth power transferring unit corresponding to the second peripheral area and connecting the display panel and the power connecting unit;
   a sixth power transferring unit corresponding to the third peripheral area and connecting the display panel and the power connecting unit; and
   a seventh power transferring unit corresponding to the fourth peripheral area and connecting the display panel and the power connecting unit.

8. The organic light emitting diode (OLED) display of claim 7, the fourth power transferring unit, the fifth power transferring unit, the sixth power transferring unit, and the seventh power transferring unit each being plural.

9. The organic light emitting diode (OLED) display of claim 8, the seventh power transferring unit neighboring the fifth power transferring unit among the plurality of seventh power transferring units is connected to the fifth power transferring unit through the power connecting unit, and the seventh power transferring unit neighboring the sixth power transferring unit among the plurality of seventh power transferring units is connected to the sixth power transferring unit through the power connecting unit.

10. The organic light emitting diode (OLED) display of claim 1, further comprising at least one power connecting unit between the neighboring power transferring units among the plurality of power transferring units.

11. The organic light emitting diode (OLED) display of claim 1, the power transferring unit being a flexible printed circuit board (FPCB), and the power connecting unit being a flexible flat cable (FFC).

12. An organic light emitting diode (OLED) display comprising:
- a display panel including a display area comprising a plurality of organic light emitting diodes for emitting light;
- a plurality of peripheral areas neighboring and surrounding the display area;
- a driver corresponding to a first one of the plurality of peripheral areas and supplying driving power to the organic light emitting diodes;
- a plurality of power transferring units respectively corresponding to the plurality of peripheral areas, the plurality of power transferring units being respectively connected to the display panel, each of the of power transferring units receiving the driving power and supplying the driving power to corresponding ones of the plurality of organic light emitting diodes; and
- a plurality of power connecting units directly connected between the driver and a predetermined one of the power transferring units and transmitting the driving power from the driver to the predetermined one of the power transferring unit, wherein other ones of said power transferring units are directly connected to the driver.

13. The organic light emitting diode (OLED) display of claim 12, the display area having a quadrangle shape at the plane of the display panel, and the plurality of peripheral areas include:
- a first peripheral area corresponding to a first edge of the quadrangle, the driver being disposed corresponding to the first peripheral area;
- a second peripheral area corresponding to a second edge neighboring the first edge of the quadrangle;
- a third peripheral area corresponding to a third edge neighboring the first edge of the quadrangle and simultaneously facing the second edge; and
- a fourth peripheral area corresponding to a fourth edge facing the first edge of the quadrangle.

14. The organic light emitting diode (OLED) display of claim 13, the plurality of power transferring units including:
- a first power transferring unit corresponding to the second peripheral area and being directly connected to the driver;
- a second power transferring unit corresponding to the third peripheral area and being directly connected to the driver; and
- a third power transferring unit corresponding to the fourth peripheral area and being connected to the driver via the power connecting units.

15. The organic light emitting diode (OLED) display of claim 13, the plurality of power transferring units including:
- a first plurality of power transferring units corresponding to the first peripheral area and being directly connected to the driver;
- a second plurality of power transferring units corresponding to the second peripheral area and being connected to the driver via the power connecting units;
- a third power transferring unit corresponding to the third peripheral area and being connected to the driver via the power connecting units; and
- a fourth power transferring unit corresponding to the fourth peripheral area and being connected to the driver via second and third plurality of power transferring units and the power connecting units.

16. The organic light emitting diode (OLED) display of claim 15, the second plurality of power transferring units comprising at least a first pair of power transferring units connected to each other by one of the power connecting units, and the third plurality of power transferring units comprising at least a second pair of power transferring units connected to each other by another one of the power connecting units.

17. The organic light emitting diode (OLED) display of claim 16, the fourth power transferring unit comprising at least a third pair of power transferring units separated from each other, a first one of said third pair of power transferring units being connected to one of the second plurality power transferring units by one of the power connecting units; and a second one of said third pair of power transferring units being connected to one of the third plurality of power transferring units by one of the power connecting units.

18. The organic light emitting diode (OLED) display of claim 12, the driving power including a first power and a second power, and each of the organic light emitting diodes include:
- a first electrode supplied with the first power;
- an organic emission layer disposed on the first electrode; and
- a second electrode disposed on the organic emission layer and supplied with the second power.

19. The organic light emitting diode (OLED) display of claim 12.

* * * * *